United States Patent
Basker et al.

(10) Patent No.: US 10,032,711 B2
(45) Date of Patent: Jul. 24, 2018

(54) INTEGRATING METAL-INSULATOR-METAL CAPACITORS WITH AIR GAP PROCESS FLOW

(71) Applicant: International Business Machines Corporation, Armonk, NY (US)

(72) Inventors: Veeraraghavan S. Basker, Schenectady, NY (US); Kangguo Cheng, Schenectady, NY (US); Theodorus E. Standaert, Clifton Park, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/218,445

(22) Filed: Jul. 25, 2016

(65) Prior Publication Data

US 2018/0025974 A1    Jan. 25, 2018

(51) Int. Cl.
*H01L 23/522* (2006.01)
*H01L 23/528* (2006.01)
(Continued)

(52) U.S. Cl.
CPC ...... *H01L 23/5223* (2013.01); *H01L 21/7682* (2013.01); *H01L 21/76807* (2013.01);
(Continued)

(58) Field of Classification Search
CPC .......... H01L 23/5223; H01L 21/76807; H01L 21/7682; H01L 23/528; H01L 23/5329; H01L 28/60
(Continued)

(56) References Cited

U.S. PATENT DOCUMENTS 5,675,184 A    10/1997    Matsubayashi
5,879,985 A     3/1999    Gambino
(Continued)

OTHER PUBLICATIONS

K. Fischer et al., "Low-k Interconnect Stack with Multi-Layer Air Gap and Tri-Metal-Insulator-Metal Capacitors for 14nm High Volume Manufacturing," IEEE International Interconnect Technology Conference and IEEE Materials for Advanced Conference (IITC/MAM), May 18-21, 2015, pp. 5-8.

*Primary Examiner* — Stephen Bradley
*Assistant Examiner* — Patricia Reddington
(74) *Attorney, Agent, or Firm* — Vazken Alexanian; Ryan, Mason & Lewis, LLP

(57) ABSTRACT

Semiconductor devices are provided which have MIM (metal-insulator-metal) capacitor structures that are integrated within air gaps of on-chip interconnect structures, as well as methods for integrating MIM capacitor formation as part of an air gap process flow for fabricating on-chip interconnect structures. For example, a semiconductor device includes a dielectric layer with a first pattern of metal lines and second pattern of metal lines. Air gaps are disposed in spaces between the metal lines. Portions of the spaces between the metal lines of the first pattern of metal lines include a conformal layer of insulating material disposed on sidewalls of the metal lines and metallic material that fills the spaces between the metal lines. The first pattern of metal lines comprises a first capacitor electrode, the metallic fill material comprises a second capacitor electrode, and the conformal layer of insulating material comprises an insulating layer of a MIM capacitor structure.

12 Claims, 8 Drawing Sheets

(51) Int. Cl.
  *H01L 23/532* (2006.01)
  *H01L 21/768* (2006.01)
  *H01L 49/02* (2006.01)

(52) U.S. Cl.
  CPC ........ *H01L 23/528* (2013.01); *H01L 23/5329* (2013.01); *H01L 28/60* (2013.01); *H01L 2221/1036* (2013.01)

(58) Field of Classification Search
  USPC ....................................................... 257/534
  See application file for complete search history.

(56) References Cited

U.S. PATENT DOCUMENTS

| | | |
|---|---|---|
| 6,461,914 B1 | 10/2002 | Roberts et al. |
| 6,492,245 B1 | 12/2002 | Liu et al. |
| 6,670,237 B1 | 12/2003 | Loh et al. |
| 6,764,915 B2 | 7/2004 | Lee |
| 7,071,532 B2 | 7/2006 | Geffken et al. |
| 7,087,925 B2 | 8/2006 | Grivna |
| 7,329,955 B2 | 2/2008 | Tsau |
| 7,382,012 B2 | 6/2008 | Tu et al. |
| 7,880,268 B2 | 2/2011 | Cremer et al. |
| 8,900,988 B2 | 12/2014 | Lin et al. |
| 9,159,609 B2 | 10/2015 | Lee et al. |
| 2007/0200162 A1* | 8/2007 | Tu ................... H01L 27/10852 257/314 |
| 2010/0237467 A1* | 9/2010 | Dalton .............. H01L 21/76816 257/536 |
| 2015/0333011 A1 | 11/2015 | Ting et al. |

\* cited by examiner

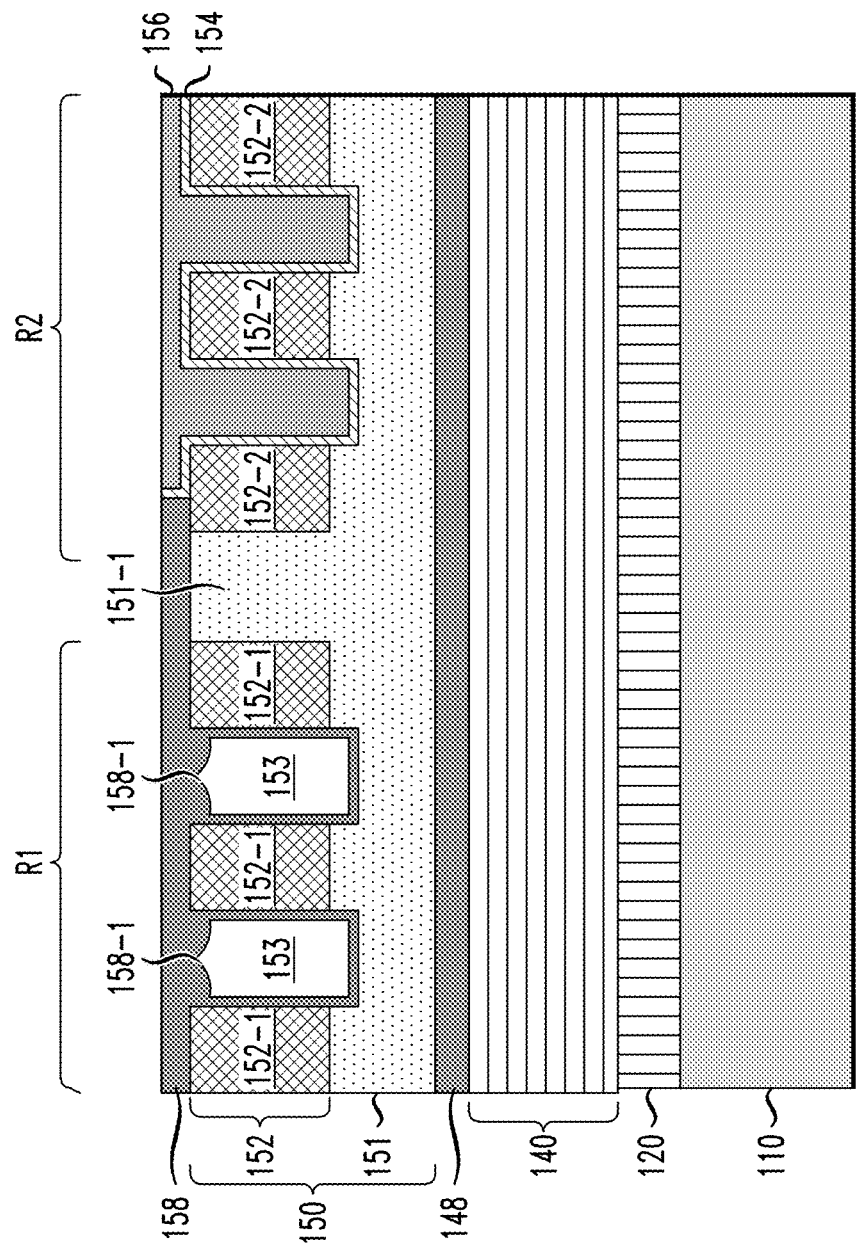

INTEGRATING METAL-INSULATOR-METAL CAPACITORS WITH AIR GAP PROCESS FLOW

TECHNICAL FIELD

This disclosure generally relates to semiconductor fabrication techniques and, in particular, techniques for fabricating MIM (metal-insulator-metal) capacitors.

BACKGROUND

Capacitors are passive circuit components that are utilized in integrated circuitry of a semiconductor chip for various purposes. For example, capacitors can be utilized to decouple power supplies, to form memory elements, to form RC delay circuits, or provide various other circuit functions. While many types of capacitor structures can be utilized, MIM capacitors are commonly used for analog, microwave, and RF (radio frequency) applications. MIM capacitors are comprised of two metal plates separated by an insulator material. The fabrication of planar MIM capacitors using conventional CMOS technologies requires multiple lithographic masking steps, which is time consuming and expensive. In this regard, the amount and complexity of additional processing steps that are incorporated as part of a semiconductor process flow to fabricate MIM capacitors should be minimized to reduce the fabrication costs and processing time for constructing semiconductor chips. In addition, since planar MIM capacitors typically occupy a relatively large footprint of die area, there is a need for small footprint, high capacitance MIM capacitor structures for highly-integrated advanced semiconductor chip applications.

SUMMARY

Embodiments of the invention include semiconductor devices having MIM capacitors that are integrated within air gaps of on-chip interconnect structures, as well as methods for integrating MIM capacitor formation as part of an air gap process flow for fabricating on-chip interconnect structures. For example, in one embodiment, a method is provided for forming a MIM capacitor. A dielectric layer is formed on a substrate and metal lines are formed in the dielectric layer, wherein the metal lines comprise a first pattern of metal lines and second pattern of metal lines. The dielectric layer is etched to form spaces between the metal lines of the dielectric layer. A capping layer is formed over the dielectric layer to form air gaps in the spaces between the metal lines of the dielectric layer. The capping layer is patterned to expose at least a portion of the first pattern of metal lines and the spaces between the metal lines of the exposed portion of the first pattern of metal lines. A conformal layer of insulating material is formed on the exposed portion of the first pattern of metal lines, and the exposed spaces between the metal lines of the first pattern of metal lines are filled with a metallic material. In one embodiment, the first pattern of metal lines comprises a first capacitor electrode of a MIM capacitor structure, the metallic material filling the exposed spaces between the metal lines of the first pattern of metal lines comprises a second capacitor electrode of the MIM capacitor structure, and the conformal layer of insulating material comprises an insulating layer of the MIM capacitor structure.

Another embodiment includes a semiconductor device. The semiconductor device comprises a dielectric layer disposed on a substrate, wherein the dielectric layer comprises metal lines disposed in the dielectric layer, wherein the metal lines comprise a first pattern of metal lines and second pattern of metal lines. The device further includes air gaps disposed in spaces between the metal lines of first pattern of metal lines and between the metal lines of the second pattern of metal lines, wherein portions of the spaces between the metal lines of the first pattern of metal lines comprise a conformal layer of insulating material disposed on sidewalls of the metal lines and metallic material that fills the portions of the spaces between the metal lines. The first pattern of metal lines comprises a first capacitor electrode of a MIM capacitor structure, the metallic material that fills said portions of the spaces between the metal lines of the first pattern of metal lines comprises a second capacitor electrode of the MIM capacitor structure, and the conformal layer of insulating material comprises an insulating layer of the MIM capacitor structure.

Other embodiments will be described in the following detailed description of embodiments, which is to be read in conjunction with the accompanying figures.

BRIEF DESCRIPTION OF THE DRAWINGS

FIGS. 3 through 8 schematically illustrate a method for fabricating the semiconductor device of FIG. 1, according to an embodiment of the invention, wherein:

FIG. 3 is cross-sectional schematic view of the semiconductor device at an intermediate stage of fabrication in which a planarized BEOL wiring level is formed having metal lines embedded in a layer of dielectric material, according to an embodiment of the invention;

FIG. 4 is cross-sectional schematic view of the semiconductor device of FIG. 3 after etching the layer of dielectric material to form spaces between the metal lines of the BEOL structure, according to an embodiment of the invention;

FIG. 5 is cross-sectional schematic view of the semiconductor device of FIG. 4 after forming a capping layer over the layer of dielectric material to form air gaps in the spaces between the metal lines of the dielectric layer of the BEOL structure, according to an embodiment of the invention;

FIG. 6 is cross-sectional schematic view of the semiconductor device of FIG. 5 after forming an etch mask which is used to etch away the dielectric material of the capping layer in the region of the BEOL structure in which MIM capacitors are to be fabricated, according to an embodiment of the invention;

FIG. 7 is cross-sectional schematic view of the semiconductor device of FIG. 6 after removing portions of the capping layer exposed through the etch mask, according to an embodiment of the invention; and FIG. 8 is cross-sectional schematic view of the semiconductor device of FIG. 7 after removing the etch mask and depositing a layer of insulting material and a layer of metallic material to form MIM capacitor structures in the BEOL structure, according to an embodiment of the invention.

DETAILED DESCRIPTION OF PREFERRED EMBODIMENTS

Embodiments of the invention will now be described in further detail with regard to semiconductor devices having MIM capacitors that are integrated within air gaps of on-chip interconnect structures (e.g., a BEOL structure), as well as methods for integrating MIM capacitor formation as part of an air gap process flow for BEOL or other on-chip interconnect structures. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1:
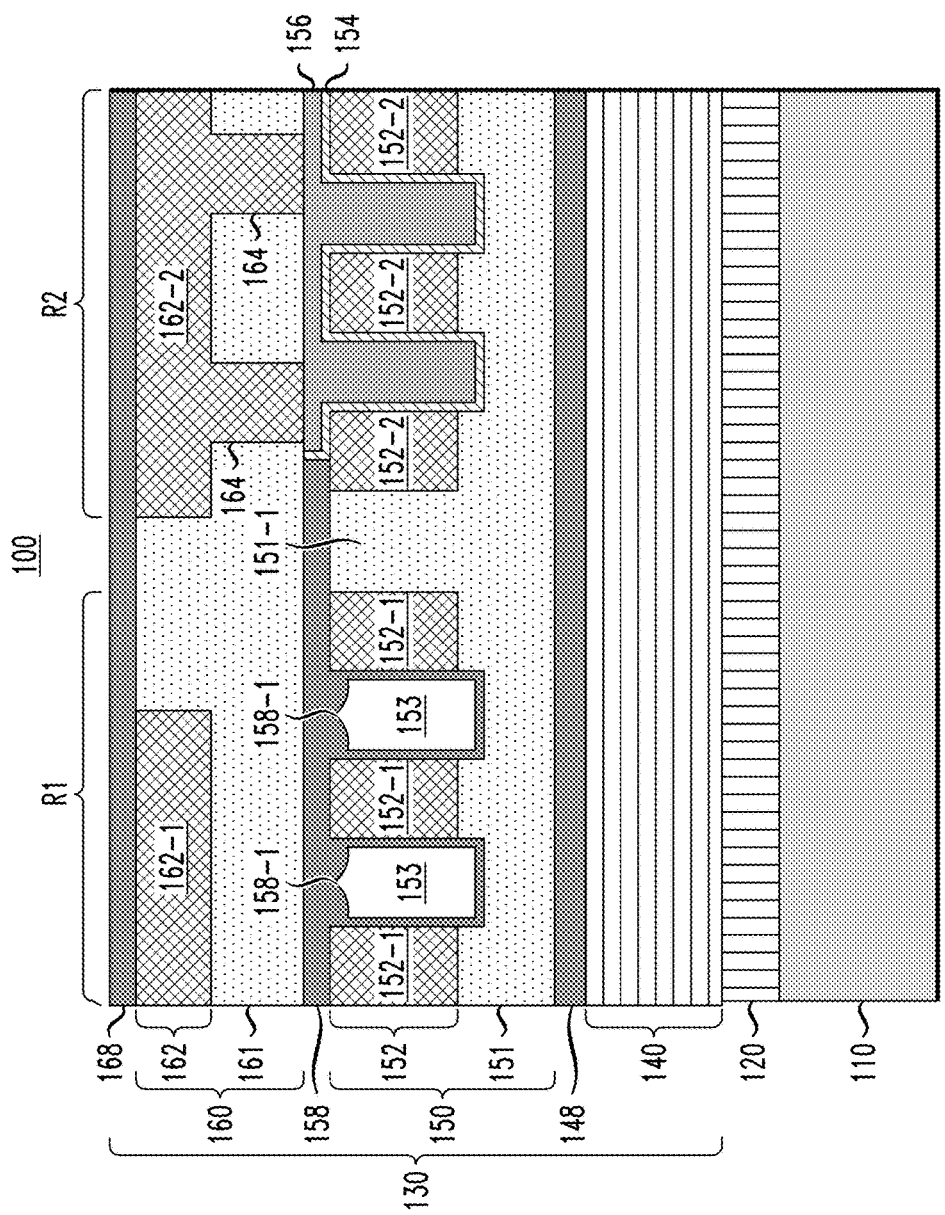
FIG. 1 is cross-sectional schematic view of a semiconductor device comprising MIM capacitor structures that are integrally formed within a BEOL structure of the semiconductor device, according to an embodiment of the invention.

FIG. 1 is cross-sectional schematic view of a semiconductor device comprising MIM capacitor structures that are integrally formed within a BEOL structure of the semiconductor device, according to an embodiment of the invention. In particular, FIG. 1 schematically illustrates a semiconductor device comprising a substrate 110, a FEOL (front-end-of-line) and MOL (middle-of-line) structure 120, and a BEOL structure 130. In one embodiment, the substrate 110 comprises a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. The thickness of the base substrate 100 will vary depending on the application. In another embodiment, the substrate 110 comprises a SOI (silicon on insulator) substrate, which comprises an insulating layer (e.g., oxide layer) disposed between a base semiconductor substrate (e.g., silicon substrate) and an active semiconductor layer (e.g., active silicon layer) in which active circuit components (e.g., field effect transistors) are formed as part of a FEOL layer.

In particular, the FEOL/MOL structure 120 comprises a FEOL layer formed on the substrate 110. The FEOL layer comprises various semiconductor devices and components that are formed in or on the active surface of the semiconductor substrate 110 to provide integrated circuitry for a target application. For example, the FEOL layer comprises FET devices (such as FinFET devices, planar MOSFET device, etc.), bipolar transistors, diodes, capacitors, inductors, resistors, isolation devices, etc., which are formed in or on the active surface of the semiconductor substrate 110. In general, FEOL processes typically include preparing the substrate 110 (or wafer), forming isolation structures (e.g., shallow trench isolation), forming device wells, patterning gate structures, forming spacers, forming source/drain regions (e.g., via implantation), forming silicide contacts on the source/drain regions, forming stress liners, etc.

The FEOL/MOL structure 120 further comprises a MOL layer formed on the FEOL layer. In general, the MOL layer comprises a PMD (pre-metal dielectric layer) and conductive contacts (e.g., via contacts) that are formed in the PMD layer. The PMD layer is formed on the components and devices of the FEOL layer. A pattern of openings is formed in the PMD layer, and the openings are filled with a conductive material, such as tungsten, to form conducive via contacts that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a first level of metallization of the BEOL structure 130.

The BEOL structure 130 is formed on the FEOL/MOL structure 120 to connect the various integrated circuit components of the FEOL layer. As is known in the art, a BEOL structure comprises multiple levels dielectric material and levels of metallization embedded in the dielectric material. The BEOL metallization comprises horizontal wiring, interconnects, pads, etc., as well as vertical wiring in the form of conductive vias that form connections between different interconnect levels of the BEOL structure. A BEOL fabrication process involves successive depositing and patterning of multiple layers of dielectric and metallic material to form a network of electrical connections between the FEOL devices and to provide I/O connections to external components.

As explained in further detail below, in accordance with exemplary embodiments of the invention, the BEOL structure 130 comprises integrated MIM capacitor structures that are formed using a BEOL process flow that combines an air gap integration process flow with a MIM capacitor process flow to form MIM capacitor structures in one or more interconnect levels of the BEOL structure 130. Advantageously, embodiments of the invention allow MIM capacitors to be fabricated as using standard interconnect process flows, which reduces processing costs and time for manufacturing MIM capacitors which are normally fabricated in different process flows.

In the example embodiment of FIG. 1, BEOL structure 130 comprises a first interconnect level 140, a second interconnect level 150, and a third interconnect level 160. The first interconnect level 140 is generically depicted, and can include one more inter-level dielectric (ILD) layers and metallic via and wiring levels (e.g., copper damascene structures). A capping layer 148 is formed between the first interconnect level 140 and the second interconnect level 150. The second interconnect level 150 comprises an ILD layer 151 and metal wiring 152 formed in the ILD layer 151. The metal wiring 152 comprises a pattern of metal lines 152-1 formed in a first region R1 (alternatively referred to as "logic region") of the BEOL structure 130, and a pattern of metal lines 152-2 formed in a second region R2 (alternatively referred to as "capacitor region") of the BEOL structure 130. The first region R1 comprises air gaps 153 that are formed in spaces between the metal lines 152-1 as a means to decrease the effective dielectric constant (k value) of the of the ILD layer 151 and to decrease parasitic capacitance between the metal lines 152-1 in the first region R1. The second interconnect level 150 further comprises a thin conformal insulating layer 154 formed over the metal lines 152-2 and a layer of metallic material 156 formed over the insulating layer 154 filling the spaces between the metal lines 152-2.

In the example embodiment of FIG. 1, the structures 152-2/154/156 form a MIM capacitor structure, wherein the metal lines 152-2 collectively form at least a portion of a first capacitor electrode, the insulating layer 154 serves as a capacitor insulating layer, and wherein the layer of metallic material 156 serves as a second capacitor electrode. As explained in further detail below, a dielectric air-gap integration process is performed as part of the BEOL fabrication process to form air gaps between the metal lines 152-1 and 152-2 in respective regions R1 and R2. The air gaps 153 are formed by etching away portions of the dielectric material of the ILD layer 151 to form spaces between the metal lines 152-1 and between the metal lines 152-2 of the metal wiring layer 152, and then depositing a layer of dielectric material using a non-conformal deposition process (e.g., chemical vapor deposition) to form a dielectric capping layer 158 with "pinch-off" regions (e.g., elements 158-1 shown in FIGS. 1 and 5) which "pinch-off" the upper portions of the spaces, thereby forming the air gaps 153. In the capacitor region R2, a portion of the capping layer 158 is then etched away to expose at least a portion of the first pattern of metal lines 152-2 and the spaces between the metal lines 152-2, and the insulating layer 154 and metallic layer 156 are sequentially deposited to fill the spaces between the metal lines 152-2 to form MIM capacitors in the capacitor region R2.

In the example embodiment of FIG. 1, the third interconnect level 160 comprises electrodes and conductive vias that provide electrical contacts to the MIM capacitor structures in the second interconnect level 150. In particular, the third interconnect level 160 comprises an ILD layer 161 and metal wiring 162 formed in the ILD layer 161. The metal wiring 162 comprises a metal line 162-1 formed in the first region R1 of the BEOL structure 130, and a metal line 162-2 and metal vias 164 formed in the second region R2. The metal vias 164 provide vertical connections between the metal line 162-2 and the layer of metallic material 156 forming the second capacitor electrode. The metal line 162-2 serves as a contact electrode for the MIM capacitor structure. An MIM capacitor structure and associated contact electrodes will be discussed in further detail with reference to FIG. 2.

Figure 2:
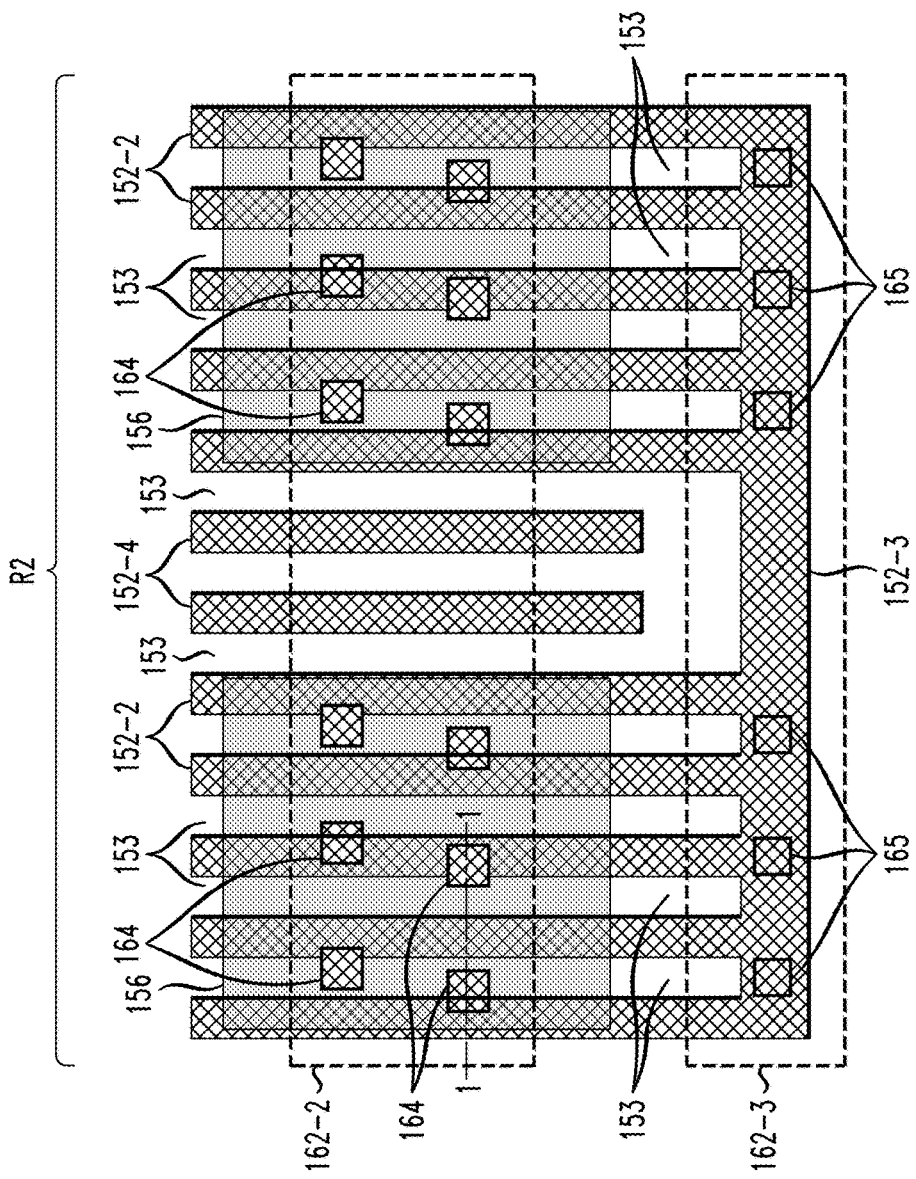
FIG. 2 is a schematic top plan view of a semiconductor device showing a layout of a MIM capacitor structure and associated electrodes, which are formed as part of a BEOL structure of the semiconductor device, according to an embodiment of the invention.

FIG. 2 is a schematic top plan view of a BEOL structure of a semiconductor device, which shows a layout of a MIM capacitor structure and associated contact electrodes, according to an embodiment of the invention. More specifically, in one embodiment, FIG. 2 schematically illustrates an exemplary layout of the capacitor region R2 of the BEOL structure 130 of FIG. 1. To provide structural context, it is to be noted that FIG. 1 illustrates a cross-sectional view of a portion of the capacitor region R2 shown along line 1-1 in FIG. 2. FIG. 2 illustrates a larger footprint area of the capacitor region R2 shown in FIG. 1 to illustrate an example layout pattern of a MIM capacitor. In particular, FIG. 2 shows a layout pattern of a MIM capacitor structure comprising a first capacitor electrode 152-2/152-3, and a second capacitor electrode 156. The first capacitor electrode 152-2/152-3 comprises a plurality parallel metal lines 152-2 that are commonly connected at one end to an elongated metal line 152-3. The first capacitor electrode 152-2/152-3 comprises a pattern of metallization formed in the ILD layer 151 of the second interconnect level 150 of FIG. 1.

The second capacitor electrode 156 as shown in FIG. 2 comprises two separate rectangular-shaped metallization patterns that overlap portions of the metal lines 152-2 of the first capacitor electrode 152-2/152-3. As discussed above with reference to FIG. 1, the second capacitor electrode 156 comprises metallic material that is deposited within the spaces between the metal lines 152-2 that form the first capacitor electrode 152-2/152-3. In addition, FIG. 2 shows metal lines 152-4 disposed between the metal lines 152-2 of the first capacitor electrode 152-2/152-3. The metal lines 152-4 represent additional wiring that can be included in the capacitor region R2 to provide connections within the BEOL structure for logic devices and components other than the MIM capacitors.

FIG. 2 further illustrates regions in which air gaps 153 exist between and around the metal lines 152-2, 152-3, and 152-4 of the second interconnect level 150. As noted above, the air gaps 153 are formed by "pinch-off" of the dielectric material that is deposited via a non-conformal deposition process to form the capping layer 158 (shown in FIG. 1). The capping layer 158 is patterned to form openings in the capping layer 158, wherein the openings in the capping layer 158 correspond to the footprints of the metallization forming the second capacitor electrode 156 (as shown in FIG. 2). The etched openings in the capping layer 158 serve to expose at least a portion of the pattern of metal lines 152-2 and the spaces between the metal lines 152-2, which spaces are then filled with metallic material to form the second capacitor electrode 156. It is to be understood that for ease of illustration, the capping layer 158 and the insulating layer 164 of the MIM capacitor structure are not shown in FIG. 2.

FIG. 2 further depicts an example layout of contact electrodes 162-2 and 162-3 and associated metal vias 164 and 165, which are formed in the third interconnect level 160 to provide electrical contacts to the respective capacitor electrodes. For ease of illustration, the rectangular footprints of the contact electrodes 162-2 and 162-3 are shown in FIG. 2 as dashed lines. In particular, as depicted in FIG. 2, a first contact electrode 162-3 overlaps the metal line 152-3 of the first capacitor electrode 152-2/152-3, and the metal vias 165 provide vertical connections between the first contact electrode 162-3 and the metal line 152-3 of the first capacitor electrode 152-2/152-3. As further shown in FIG. 2, a second contact electrode 162-2 overlaps the metallization of the second capacitor electrode 156, and the metal vias 164 provide vertical connections between the second contact electrode 162-2 and the metallization of the second capacitor electrode 156.

Figure 3:
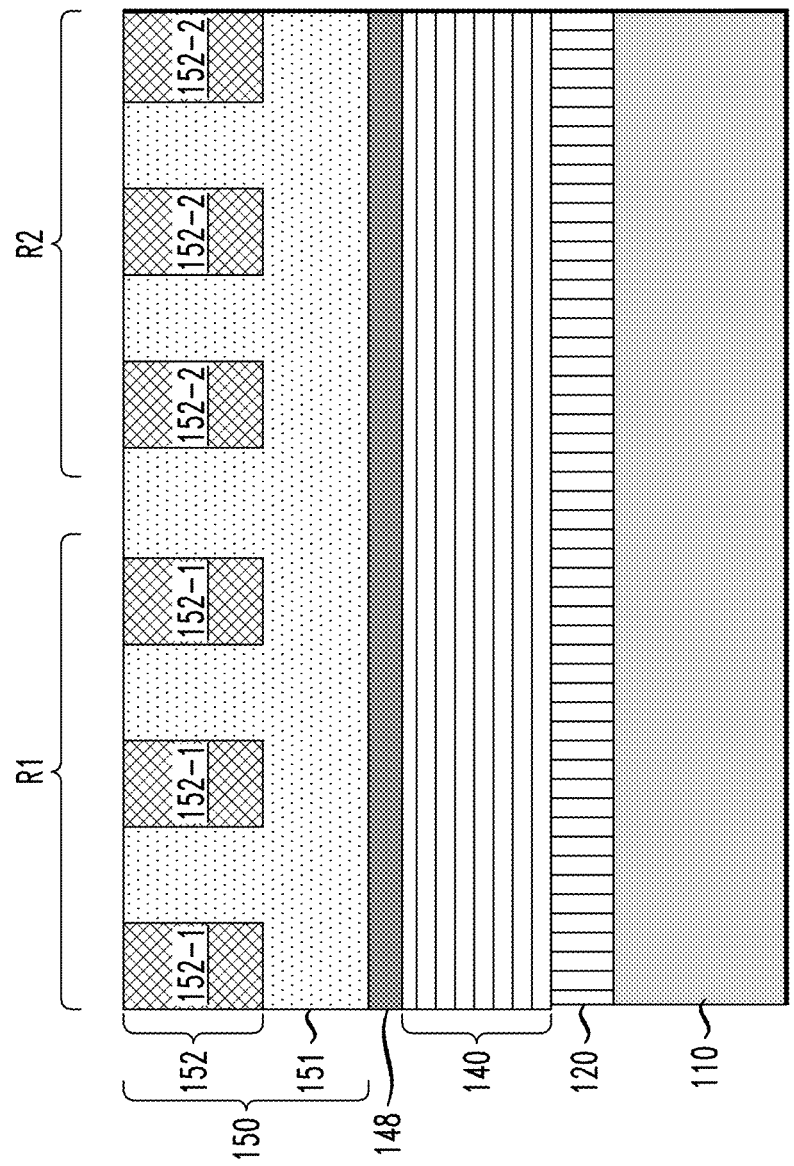

Methods for fabricating semiconductor devices such as shown in FIGS. 1 and 2 will now be discussed in further detail with reference to FIGS. 3 through 8, which schematically illustrate the semiconductor device 100 of FIG. 1 at various stages of fabrication. For example, FIG. 3 is cross-sectional schematic view of the semiconductor device 100 at an intermediate stage of fabrication in which a planarized BEOL wiring level is formed having metal lines disposed in a layer of dielectric material, according to an embodiment of the invention. In particular, FIG. 3 schematically illustrates the semiconductor device 100 of FIG. 1 at an intermediate stage of fabrication after sequentially forming the FEOL/MOL structure 120, the first interconnect level 140, and the capping layer 148 on top of the substrate 110. In addition, FIG. 3 schematically illustrates an intermediate stage of fabrication of the second interconnect level 150 of the BEOL structure 130 of FIG. 1, wherein the pattern of metal lines 152-1 and the pattern of metal lines 152-2 are formed in the ILD layer 151.

The capping layer 148 serves to insulate metallization of the first interconnect level 140 from the dielectric material of the ILD layer 151. For example, the capping layer 148 serves to improve interconnect reliability and prevent copper metallization from diffusing into the ILD layer 151 of the second interconnect level 150. The capping layer 148 may include any suitable insulating or dielectric material including, but not limited to, silicon nitride (SiN), silicon carbide (SiC), silicon carbon nitride (SiCN), hydrogenated silicon carbide (SiCH), a multilayer stack comprising the same or different types of dielectric materials, etc. The capping layer 148 can be deposited using standard deposition techniques, for example, chemical vapor deposition. The capping layer 148 can be formed with a thickness in a range from about 2 nm to about 60 nm.

The ILD layer 151 can be formed using any suitable dielectric material including, but not limited to, silicon oxide (e.g. SiO2), SiN (e.g., (Si3N4), hydrogenated silicon carbon oxide (SiCOH), silicon based low-k dielectrics, porous dielectrics, or other known ULK (ultra-low-k) dielectric materials. The ILD layer 151 can be deposited using known deposition techniques, such as, for example, ALD (atomic layer deposition), CVD (chemical vapor deposition) PECVD (plasma-enhanced CVD), or PVD (physical vapor deposition). The thickness of the ILD layer 151 will vary depending on the application, and may have a thickness in a range of about 30 nm to about 200 nm, for example.

The metallization layer 152 can be formed using known materials and known techniques. For example, Cu/low-k interconnect structures can be fabricated using a damascene process (e.g., single or dual damascene) with PECVD deposited ILD layers, PVD Cu barrier layers, and electrochemically plated Cu wires/vias. In particular, in one embodiment of the invention, after depositing the ILD layer 151, standard photolithography and etch processes can be performed to pattern the ILD layer 151 by forming damascene openings (e.g., trenches and via openings) in the ILD layer 151, and then filling such damascene openings with metallic material to form the pattern of metal lines 152-1 and 152-2. It is to be noted that while no vertical vias are shown in the ILD layer 151, it is to be understood that vertical vias would exist in the second interconnect level 150 to provide vertical connections to metallization in the underlying interconnect level 140.

In one embodiment, after forming the damascene openings in the ILD layer 151, a conformal layer of liner material is preferably deposited to line the sidewall and bottom surfaces of the damascene openings in the ILD layer 151 with a thin liner layer (not specifically shown in FIG. 3). The thin liner layer may be formed by conformally depositing one or more thin layers of material such as, for example, tantalum nitride (TaN), cobalt (Co), or ruthenium (Ru), or other liner materials (or combinations of liner materials such as Ta/TaN, TiN, CoWP, NiMoP, NiMoB) which are suitable for the given application. The thin liner layer serves multiple purposes. For example, the thin liner layer serves as a barrier diffusion layer to prevent migration of metallic material (e.g., Cu) into the ILD layer 151. In addition, the thin liner layer serves as an adhesion layer to provide good adhesion to the metallic material (e.g., Cu) that is used to fill the damascene openings in the ILD layer 151 and form the metal lines 152-1 and 152-2 (and vertical vias, not shown).

The metallization layer 152 is formed by depositing a conductive material such as, for example, copper (Cu), aluminum (Al), or tungsten (W), to fill the damascene openings in the ILD layer 151. The conductive material can be deposited using known techniques such as electroplating, electroless plating, CVD, PVD, or a combination of methods. Prior to filling the damascene openings in the ILD layer 151 with the conductive material, a thin seed layer (e.g., Cu seed layer) may optionally be deposited using a suitable deposition technique such as ALD, CVD or PVD. The seed layer can be formed of a material which enhances adhesion of the metallic material on the underlying material and which serves as catalytic material during a subsequent plating process. For example, a thin conformal Cu seed layer can be deposited over the surface of the substrate using PVD to line the surfaces of the damascene openings, followed by the electroplating of Cu to fill the damascene openings (vias and trenches) formed in the ILD layer 151 and, thus, form a Cu metallization layer 152. The overburden liner, seed, and metallization materials are then removed by performing a chemical mechanical polishing process (CMP) to planarize the surface of the semiconductor structure down to the ILD layer 151, resulting in the intermediate structure shown in FIG. 3.

In one embodiment of the invention, after performing the CMP process, a protective layer can be formed on the exposed surfaces of the metal lines 152-1 and 152-2 to protect the metallization from potential damage as a result of subsequent etching processes. For example, for copper metallization, a selective Co deposition process can be performed to selectively deposit a thin capping layer of Co on the exposed surfaces of the metal lines 152-1 and 152-2 shown in FIG. 3. A protective Co capping layer on the metal lines 152-1 and 152-2 would allow for more aggressive etching conditions, etc., when forming air gaps and MIM capacitor structures using techniques discussed hereafter.

Figure 4:
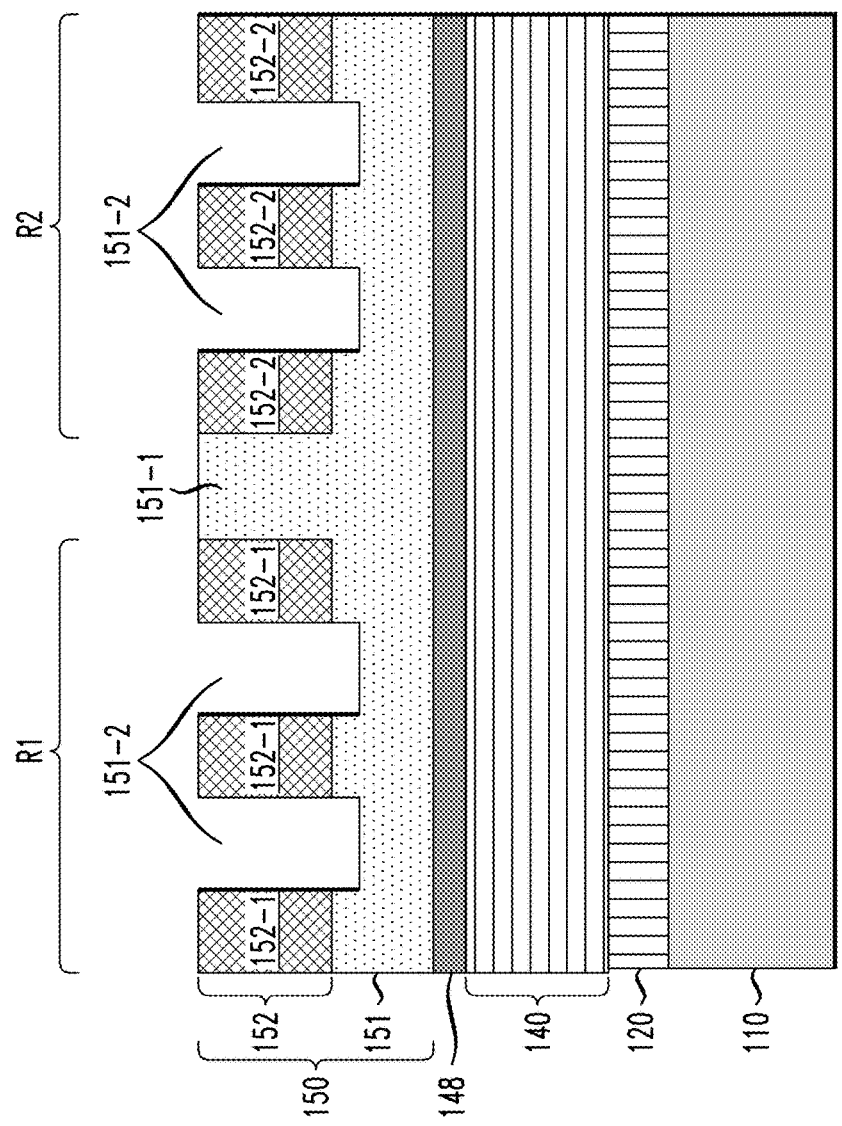
Figure 5:
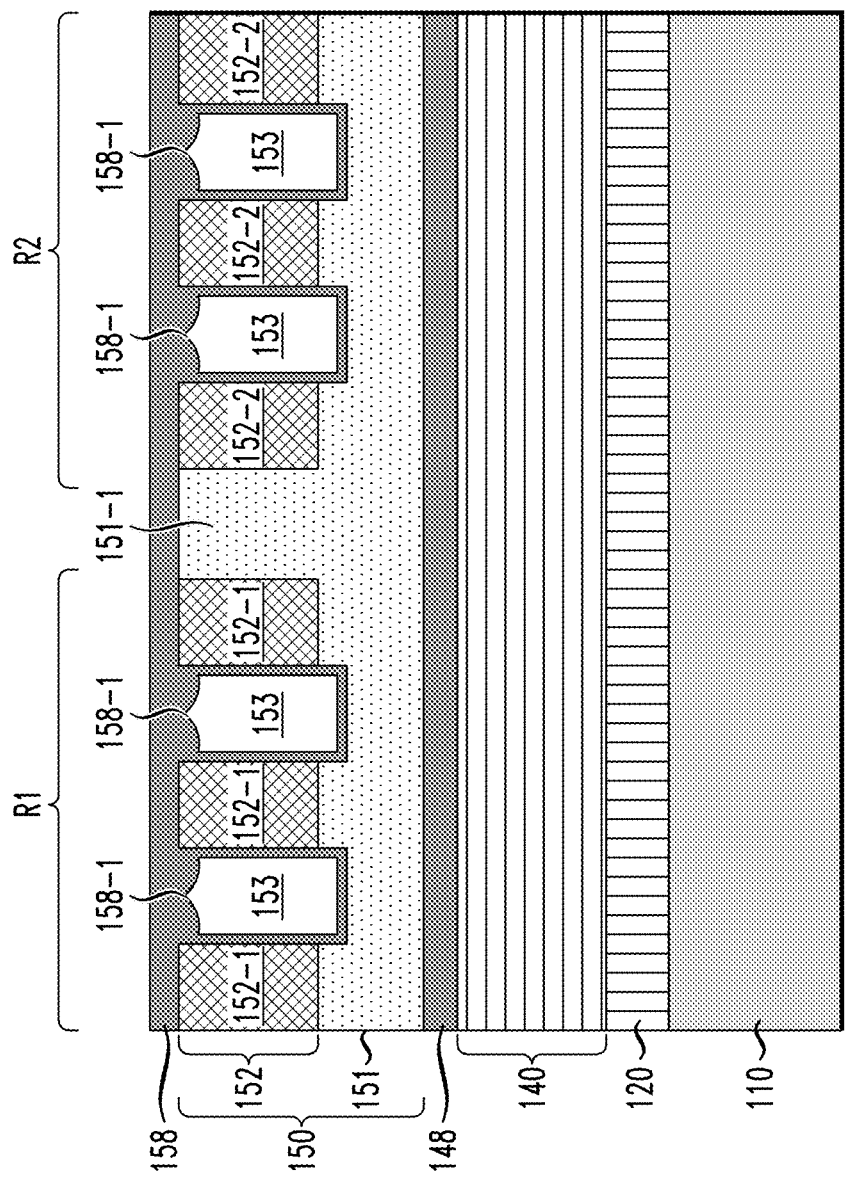

A next step in the fabrication process comprises forming air gaps in the second interconnect level 150 using a process flow as schematically depicted in FIGS. 4 and 5. In particular, FIG. 4 is cross-sectional schematic view of the semiconductor device of FIG. 3 after etching the ILD layer 151 to form spaces 151-2 between the metal lines 152-1 and between the metal lines 152-2 of the ILD layer 151, according to an embodiment of the invention. In one embodiment, any suitable masking (e.g., photoresist mask) and etching technique (e.g., RIE (reactive ion etch)) can be used to recess portions of the ILD layer 151 between the metal lines 152-1 and between the metal lines 152-2 to form the spaces 151-2, as shown in FIG. 4. For example, a dry etch technique using a fluorine-based etchant can be used to etch away the dielectric material of the ILD layer 151 between the metal lines 152-1 and 152-2 to form the spaces 151-2. In one embodiment, the spaces 151-2 are formed such that the recessed surface of the ILD layer 151 is below the bottom surfaces of the metal lines 152-1 and 152-2. In addition, portions 151-1 of the ILD layer 151 which are disposed between metal lines (e.g., metal lines 152-1 and 152-2, as shown in FIG. 5) that are spaced relatively far apart, are not removed, since the interline capacitance between the widely spaced metal lines is assumed to be negligible.

Next, FIG. 5 is cross-sectional schematic view of the semiconductor device of FIG. 4 after forming the capping layer 158 over the ILD layer 151 to form air gaps 153 in the spaces between the metal lines 152-1 and between the metal lines 152-2 of the ILD layer 151, according to an embodiment of the invention. With this process a layer of dielectric material is deposited using a non-conformal deposition process (e.g., chemical vapor deposition) to form the dielectric capping layer 158, wherein the deposition process causes "pinch-off" of the upper portions of the spaces between the metal lines, thereby forming the air gaps 153. In one embodiment of the invention, the capping layer 158 is formed by PECVD deposition of SiN or SiCN. With this deposition process, the conformality of the dielectric material deposition is low so that while the capping layer 158 covers the surface of the semiconductor structure, "pinch-off" regions 158-1 are formed in the capping layer 158 above the spaces between the metal lines where the dielectric material of the ILD layer 151 was removed, thereby forming the air gaps 153 between the narrowly spaced metal lines.

As shown in FIG. 5, during formation of the capping layer 158, a thin layer of the dielectric material is deposited on the vertical sidewall and bottom surfaces of the spaces, but the nonconformal CVD process results in formation of the "pinch-off" regions 158-1 to prevent any further filling of the air spaces with dielectric material, thereby resulting in the formation of the air gaps 153 in the spaces between adjacent metal lines, as depicted in FIG. 5. Following deposition of the dielectric material used to form the capping layer 158, a CMP process may be performed to planarize the capping layer 158, resulting in the planarized semiconductor structure shown in FIG. 5.

The dielectric constant of air is about unity, which is much less than the dielectric constant of the dielectric material of the ILD layer 151. As such, the resulting "air spacers" formed by the air gaps 153 provide enhanced electrical performance by reducing parasitic capacitance between metal lines 152-1 in the logic region R1, as well as other metal lines in the capacitor region R2 (e.g., metal lines 152-4 in FIG. 2). However, in the capacitor region R2, at least a portion of the capping layer 158 is etched away to expose at least a portion of the metal lines 152-2 and the spaces between the metal lines 152-2, wherein the exposed spaces are then lined with a layer of insulating material and filled with a metallic material to form MIM capacitors in the capacitor region R2, using a process flow as schematically illustrated in FIGS. 6, 7 and 8.

Figure 6:
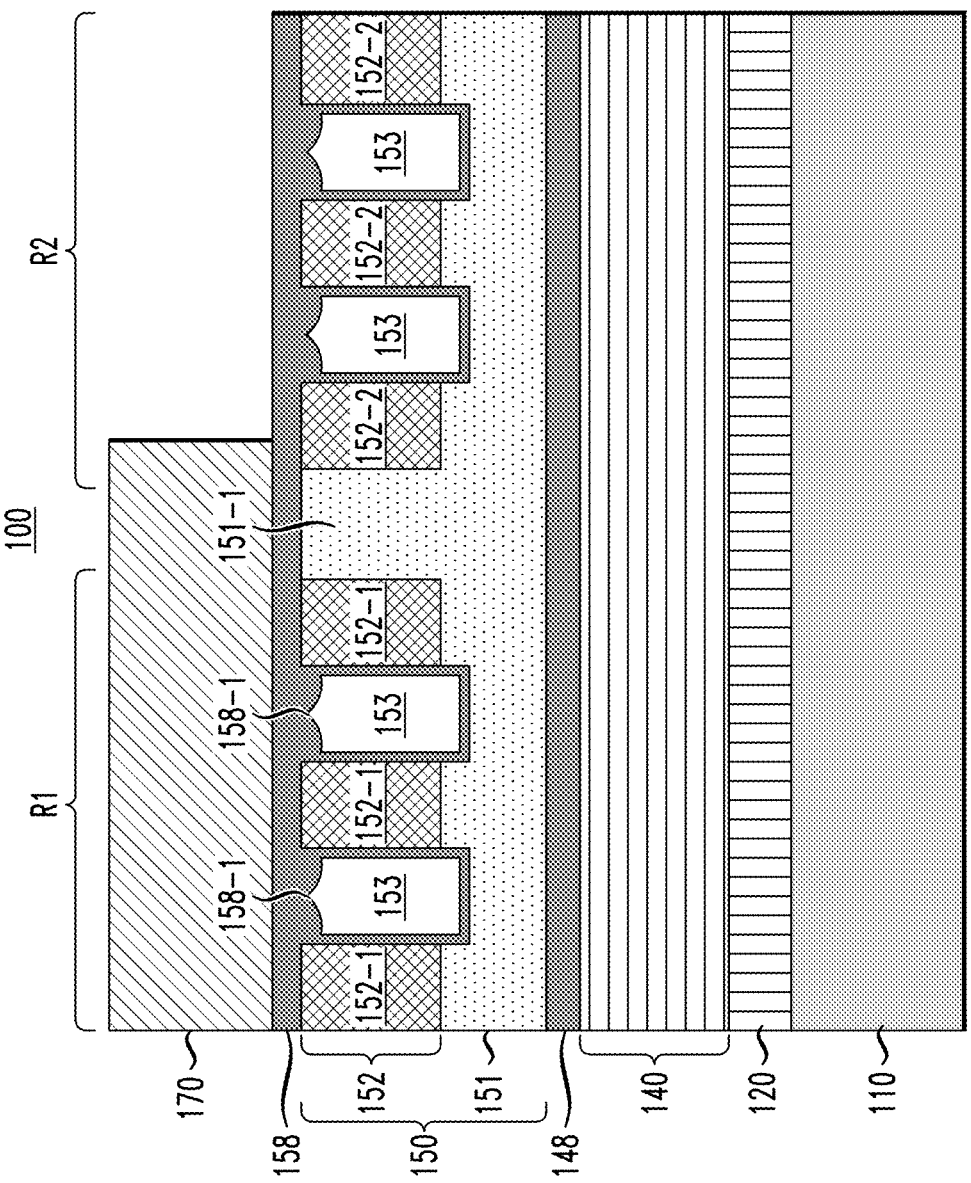

For example, FIG. 6 is cross-sectional schematic view of the semiconductor device of FIG. 5 after forming an etch mask which is used to etch away the dielectric material of the capping layer in the region of the BEOL structure in which MIM capacitors are to be fabricated, according to an embodiment of the invention. In particular, FIG. 6 illustrates an etch mask 170 having openings to expose portions of the capping layer 158 in the capacitor region R2, which are to be etched away to expose at least a portion of the metal lines 152-2 and the spaces between the metal lines 152-2. By way of example, in the context of the example embodiment of FIG. 2, the etch mask 170 would be formed to have a pattern of openings which correspond to the footprint pattern of the metallic material 156 that serves as the second capacitor electrode of an MIM capacitor structure. In one embodiment, the etch mask 170 may be a photoresist mask that is formed using a standard photolithographic process.

Figure 7:
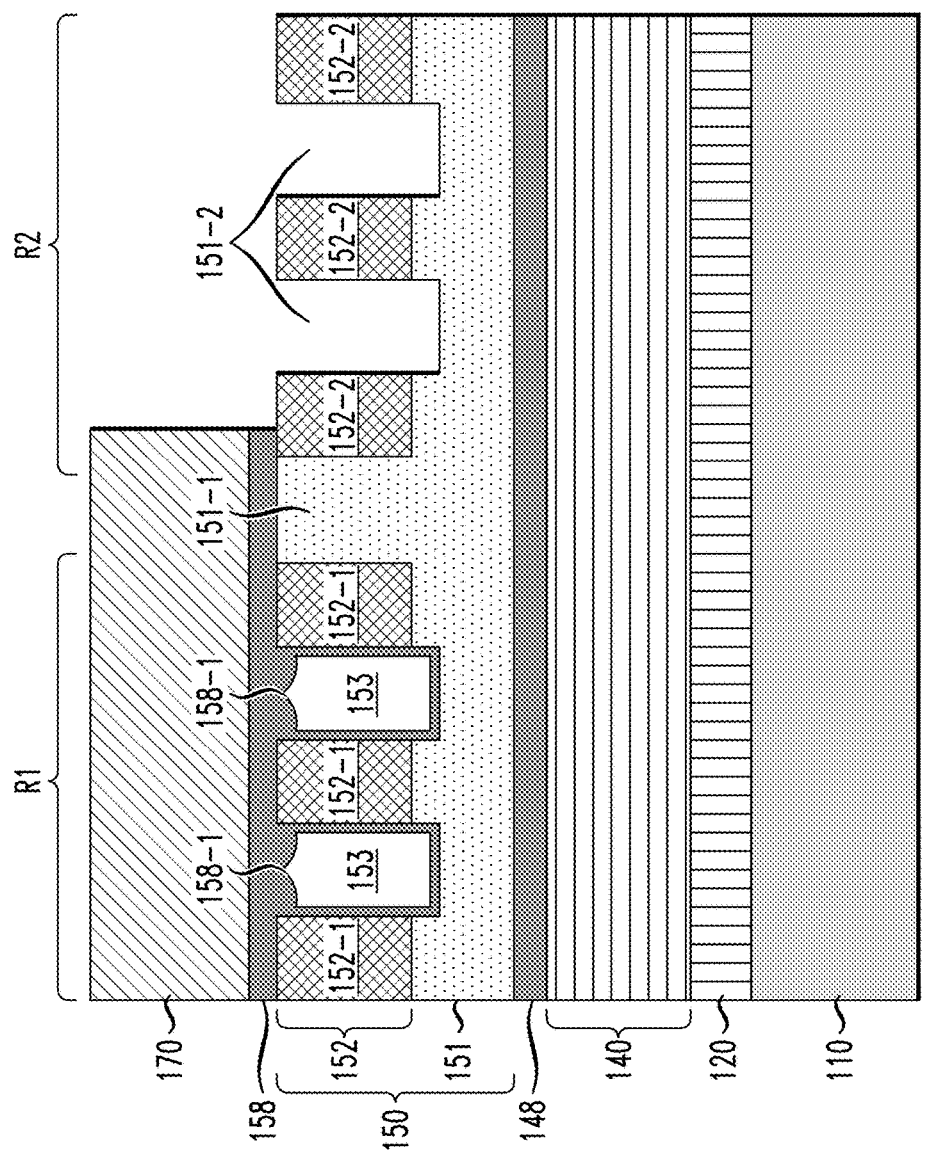

Next, FIG. 7 is cross-sectional schematic view of the semiconductor device of FIG. 6 after removing the portions of the capping layer 158 in the capacitor region R2 which are exposed through the openings of the etch mask 170, according to an embodiment of the invention. The exposed portions of the capping layer 158 (as well as the dielectric material lining the sidewalls of the metal lines 152-2 and the recessed surface of the ILD layer 151 within the spaces 151-2 between the metal lines 152-2) can be removed using a suitable dry etch process with an etch chemistry that is selective to the metallic material of the metal lines 152-2 and the dielectric material of the ILD layer 151. Following the etch process, the etch mask 170 is stripped.

A next stage in the exemplary process flow comprises depositing a conformal layer of insulating material followed by depositing metallic material to fill the exposed spaces 151-2 between the metal lines 152-3 in the capacitor region R2. For example, FIG. 8 is cross-sectional schematic view of the semiconductor device of FIG. 7 after removing the etch mask and forming a conformal layer of insulating material 154 on the exposed portions of the metal lines 152-2, and filling the exposed spaces 151-2 between the metal lines 152-2 with a metallic material 156. The conformal layer of insulating material 154 is formed to conformally to line exposed surfaces of the metal lines 152-2 and the ILD layer 152 within the exposed spaces 151-2 with a thin insulating layer that serves as capacitor insulating layer of an MIM capacitor in the capacitor region R2. The layer of metallic material 156 is deposited to fill the exposed spaces 151-2 between the metal lines 152-2 and to cover the metal lines 152-2, and thereby form a second capacitor electrode of the MIM capacitor in the capacitor region. Following the deposition of the conformal insulating layer 154 and the layer of metallic material 156, a CMP process is performed to remove the overburden insulating and metallic material down to the surface of the capping layer 158, resulting in the planarized semiconductor structure shown in FIG. 8.

In one embodiment of the invention, the conformal insulating layer 154 is formed of a high-k dielectric material having a dielectric constant of about 3.9 or greater. For example, the insulating layer 154 can a material including, but not limited to, $SiO_2$ (k–3.9), $HfO_2$ (k=25), $HfSiO_4$ (k=11), $ZrO_2$ (k=25), $Al_2O_3$ (k=9), $TiO_2$ (k=80), $Ta_2O_5$ (k=22), $La_2O_3$ (k=30), $SrTiO_3$ (k=2000), $LaAlO_3$ (k=30) and combinations thereof. The conformal insulating layer 154 can be formed using ALD or PVD, for example. Further, in one embodiment, the metallic material 156 may be formed of any suitable metallic material such as tungsten (W), copper, or ruthenium, for example. In one embodiment, the metallic material 156 (which forms the second capacitor electrode) is formed of the same material (e.g., copper) of the metal lines 152-2 (which form the first capacitor electrode).

If the layer of metallic material 156 comprises copper, an additional capping layer (e.g., SiN layer) should be formed on the surface of the structure shown in FIG. 8 prior to deposition of the dielectric material forming the ILD layer 161 of the next interconnect level 160. On the other hand, if the layer of metallic material 156 is formed of tungsten, the ILD layer 161 of the next interconnect level 160 can be deposited on the layer of metallic material 156 (without having to form an additional capping layer) as tungsten is not reactive with the typical dielectric materials that would be used to form the ILD layer 161. While tungsten material may have higher resistance than copper material, it is not necessary in many applications to utilize low resistance metallic material for second capacitor electrode 156. In operation, the second capacitor electrode 156 (e.g., tungsten) can be grounded, while the first capacitor electrode (formed by copper metal lines 152-2) can be connected to the higher operating voltage.

Following the formation of the second interconnect level 150 as shown in FIG. 8, the third interconnect level 160 (as shown in FIG. 1) of the BEOL structure 130 can be formed using the same techniques and materials as discussed above with reference to FIG. 3. In particular, as discussed above with reference to the example embodiments of FIGS. 1 and 2, the third interconnect level 160 could include metallization (e.g., metal lines 162-2/162-3, and vertical vias 164/165) to provide wiring and interconnects to the capacitor electrodes of the MIM capacitors formed in the second interconnect level 150 of the BEOL structure 130. Moreover, one or more additional interconnect levels can be formed over the third interconnect level 160, wherein MIM capacitor structures can be integrally formed in any one of the additional interconnect levels using techniques as discussed herein.

As can be seen in FIG. 8, as compared to a planar MIM capacitor structure, an MIM capacitor structure according to an embodiment of the invention utilizes the air gap topography to increase the capacitive surface area (A) for a given 2D footprint. Indeed, the vertical interfaces between the sidewalls of the metal lines 152-2 (which collectively provide the first capacitor electrode) and the layer of metallic material 156 which fills the spaces 151-2 (to provide the second capacitor electrode), increase the capacitive surface area (A) of the MIM capacitor structure, as compared to the horizontal interfaces between the first and second electrode alone. As is known in the art, the capacitance of a MIM capacitor structure is directly proportional to the surface area (A) of the overlap between the first and second capacitor electrodes, directly proportional to the dielectric constant of the insulating layer 154, and inversely proportional to the thickness of the insulating layer 154. In this regard, a relatively large capacitance can be achieved in a relatively small capacitor footprint region by implementing a MIM capacitor structure (such as shown in FIG. 8) having a thin, high-k insulating layer 154, and having relatively long vertical interfaces between the metal lines 152-2 (first capacitor electrode) and the conductive material 156 (second electrode) disposed in the spaces between the metal lines 152-2.

While exemplary embodiments of the invention illustrate the formation of MIM capacitor structures as part of an air gap integration flow for BEOL structures, the same techniques can be applied to form MIM capacitor structures as part of an MOL layer in which air gaps are formed in a PMD layer between vertical contacts (e.g., gate, source, drain contacts). In this regard, additional metallization can be formed within the PMD layer to serve as MIM capacitor electrodes, wherein the air gaps formed in the PMD layer of the MOL layer are lined with a capacitor insulating layer and filled with a metallic material (similar to the process shown in FIG. 8) to form MIM structures within the MOL layer. For example, the MIM capacitor structure 152-2/154/156 shown in FIG. 8 can be formed in a PMD layer of an MOL, wherein contact electrodes and vias to the MIM capacitor electrodes can be fabricated as part of the metallization of the first interconnect level of a BEOL structure formed on the MOL layer.

It is to be understood that the methods discussed herein for fabricating MIM capacitor structures in MOL or BEOL layers can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A semiconductor device, comprising:
a dielectric layer formed on a substrate;
metal lines formed in the dielectric layer, wherein the metal lines comprise a first pattern of metal lines and a second pattern of metal lines, wherein the first pattern of metal lines are commonly connected to each other to form a first capacitor electrode;
spaces etched in the dielectric layer between the metal lines of the first pattern of metal lines, and between the metal lines of the second pattern of metal lines;
a capping layer formed over the second pattern of metal lines to form air gaps in the spaces between the metal lines of the second pattern of metal lines;
a conformal layer of insulating material formed over the first pattern of metal lines to form a capacitor insulating layer; and
a metallic layer formed over the conformal layer of insulating material, wherein the metallic layer comprises metallic material that entirely fills the spaces between the metal lines of the first pattern of metal lines, wherein the metallic layer comprises a second capacitor electrode.

2. The device of claim 1, wherein the first capacitor electrode, the second capacitor electrode, and the capacitor insulating layer form of a MIM (metal-insulator-metal) capacitor structure.

3. The device of claim 2, wherein the MIM capacitor structure is integrally formed as part of a BEOL (back end of line) structure.

4. The device of claim 1, wherein the metal lines in the dielectric layer comprise damascene copper wiring formed in an ILD (interlayer dielectric layer) of a BEOL structure.

5. The device of claim 1, wherein the conformal layer of insulating material covers exposed surfaces of the metal lines of the first pattern of metal lines and exposed surfaces of the dielectric layer within the spaces between the metal lines of the first pattern of metal lines.

6. The device of claim 1, wherein the conformal layer of insulating material comprises a high-k dielectric material with a dielectric constant of about 3.9 or greater.

7. The device of claim 1, wherein the metallic layer that forms the second capacitor electrode comprises tungsten.

8. A semiconductor device, comprising:
a BEOL (back end of line) structure formed on a substrate, wherein the BEOL structure comprises:
an interlayer dielectric (ILD) layer:
copper metal lines formed in the ILD layer, wherein the copper metal lines comprise a first pattern of copper metal lines and a second pattern of copper metal lines, wherein the first pattern of copper metal lines are commonly connected to each other to form a first capacitor electrode of a MIM (metal-insulator-metal) capacitor structure;

spaces etched in the ILD layer between the copper metal lines of the first pattern of copper metal lines, and between the copper metal lines of the second pattern of copper metal lines;

a capping layer formed over the second pattern of copper metal lines to form air gaps in the spaces between the copper metal lines of the second pattern of copper metal lines;

a conformal layer of insulating material formed over the first pattern of copper metal lines to form a capacitor insulating layer of the MM capacitor structure; and a metallic layer formed over the conformal layer of insulating material, wherein the metallic layer comprises metallic material that entirely fills the spaces between the copper metal lines of the first pattern of copper metal lines, wherein the metallic layer comprises a second capacitor electrode of the MIM capacitor structure.

9. The semiconductor device 8, wherein the conformal layer of insulating material comprises a high-k dielectric material with a dielectric constant of about 3.9 or greater.

10. The semiconductor device of claim 8, wherein the metallic layer that forms the second capacitor electrode comprises tungsten.

11. The semiconductor device of claim 1, wherein the metal lines are formed of aluminum.

12. The semiconductor device of claim 1, wherein the metal lines are formed of tungsten.

* * * * *